United States Patent [19]
Shimizu et al.

[11] Patent Number: 6,031,851
[45] Date of Patent: Feb. 29, 2000

[54] MODE-LOCKED SEMICONDUCTOR LASER AND METHOD OF DRIVING THE SAME

[75] Inventors: Takanori Shimizu; Hiroyuki Yokoyama; Masayuki Yamaguchi, all of Tokyo, Japan

[73] Assignee: NEC Corporation, Tokyo, Japan

[21] Appl. No.: 08/948,046

[22] Filed: Oct. 9, 1997

[30] Foreign Application Priority Data

Oct. 11, 1996 [JP] Japan ................................ 8-270051

[51] Int. Cl.[7] .............................. H01S 3/098; H01S 3/10; H01S 3/13; H01S 3/19
[52] U.S. Cl. ................................ 372/18; 372/25; 372/30; 372/50
[58] Field of Search .............................. 372/18, 50, 96, 372/30, 25

[56] References Cited

U.S. PATENT DOCUMENTS 5,497,393   3/1996   Lee ............................................ 372/96
5,586,138   12/1996  Yokoyama .................................. 372/18

FOREIGN PATENT DOCUMENTS 5-95152   4/1993   Japan .

OTHER PUBLICATIONS

Extended Abstracts (The 57th Autumn Meeting, 1996); The Japan Society of Applied Physics, 8p–KL–3, p. 1230. (No Month Available).

S. Arahira et al., "500 GHz Optical Short Pulse Generation From A Monolithic Passively Mode–Locked Distributed Bragg Reflector Laser Diode", pp. 1917–1919, Appl. Physics, Lett. 64, No. 15, Apr. 11, 1994.

K. Sato et al., "Monolithic Strained–InGaAsP Multiple–Quantum–Well Lasers With Integrated Electroabsorption Modulators For Active Mode Locking", pp. 1–3, Appl. Physics, Lett. 65, No. 1, Jul. 4, 1994.

by S. Arahira et al., "Transform–Limited Optical Short–Pulse Generation at High Repetition Rate over 40 GHz from a Monolithic Passive Mode–Locked DBR laser Diode", *IEEE Photonics Technology Letters*, vol. 5, No. 12, Dec. 1993, pp. 1362–1365.

by T. Hoshida et al., "Generation of 33 GHz stable pulse trains by subharmonic electrical modulation of a monolithic passively mode–locked semiconductor laser", *Electronics Letters*, vol. 32, No. 6, Mar. 14, 1996, pp. 572–573.

by K. Sato et al., "Monlithic strained–InGaAsP multiple–quantum–well lasers with integrated electroabsorption modulators for active mode locking", *Applied Physics Letters*, vol. 65, No. 1, Jul. 4, 1994, pp. 1–3.

by E. Lach et al., "Multifunctional Application of Monolithic Mode Locked Laser in (O) TDM Systems: Pulse Generation and Optical Clock Recovery", *22nd European Conference in Optical Communication*, ECOC'96, Oslo, Norway, pp. 4.23–4.26.

(List continued on next page.)

*Primary Examiner*—Rodney Bovernick
*Assistant Examiner*—Quyen Phan Leung
*Attorney, Agent, or Firm*—Young & Thompson

[57] ABSTRACT

There is provided a mode-locked semiconductor laser including a saturable absorber section, a gain section having the same composition as that of the saturable absorber section, a non-absorptive waveguide section having an absorption edge wavelength shorter than an oscillation wavelength of the gain section, an electroabsorption modulator section having an absorption edge wavelength intermediate between an oscillation wavelength of the gain section and an absorption edge wavelength of the non-absorptive waveguide section, and a distributed Bragg reflector section having the same composition as that of the non-absorptive waveguide section and including a diffraction grating. These five sections are optically coupled to one another in a single waveguide. The above-mentioned mode-locked semiconductor laser makes it possible to enhance an efficiency with which high frequency signals are applied thereto, with conditions for causing saturable absorption operation, such as a section length and a bias voltage, being kept in an optimal range.

16 Claims, 2 Drawing Sheets

OTHER PUBLICATIONS by D.J. Derickson et al., "Short Pulse Generation Using Multisegment Mode–Locked Semiconductor Lasers", *IEEE Journal of Quantum Electronics,* vol. 28, No. 10, Oct. 1992, pp. 2186–2202.

D.Y. Kim et al., "Ultrastable Millimetre–wave signal generation using hybrid modelocking of a monolithic DBR laser", pp. 733–734, Electronics Letters vol. 31, No. 9, Apr. 27, 1995.

H.F. Liu et al., "Generation of Wavelength–Tunable Transform–Limited Pulses from a Monolithic Passively Mode–Locked Distributed Bragg Reflector Semiconductor Laser", pp. 1139–1141, IEEE Photonics Technology Letters, vol. 7, No. 10, Oct. 1995.

S. Arahira et al., "Transform–Limited Optical Short–Pulse Generation at High Repetition Rate over 40 GHz from a Monolithic Passive Mode–Locked DBR Laser Diode", pp. 1362–1365 IEEE Photonics Technology Letters, vol. 5, No. 12, Dec. 1993.

MODE-LOCKED SEMICONDUCTOR LASER AND METHOD OF DRIVING THE SAME

BACKGROUND OF THE INVENTION

1. Field of the Invention

The invention relates to a mode-locked semiconductor laser for generating an ultra-short optical pulse train used for ultra-fast optical communication, and more particularly to optimization of mode-locked operation. The invention also relates to a method of driving the above-mentioned mode-locked semiconductor laser.

2. Description of the Related Art

There has been long expected to establish basic techniques for ultra-fast optical communication, such as technique for generating an optical pulse train close to Fourier transform limit and having a repetition rate in the range of tens of GHz, and technique for controlling an oscillation wavelength associated with a transmission wavelength.

As one of optical oscillators for accomplishing the above-mentioned techniques, there has been used a mode-locked semiconductor laser having a four-section electrode structure including a saturable absorber section, a gain section, a distributed Bragg reflector section for controlling an oscillation wavelength, and a phase control section for continuously controlling a wavelength, these four sections being integrated.

For instance, one of such mode-locked semiconductor lasers has been suggested in "Transform-Limited Optical Short-Pulse Generation at High Repetition Rate over 40 GHz from a monolithic Passive Mode-Locked DBR Laser Diode" written by Shin Arahira et al. in IEEE Photonics Technology Letters, Vol. 5, No. 12, December 1993, pp. 1362–1365. According to the article, a monolithic passive mode-locked distributed Bragg reflector laser diode was fabricated. An optical short-pulse train with a duration of 3.5 ps was generated from the laser at a high repetition rate of over 40 GHz. The time-bandwidth product was 0.43, and was quite close to the transform-limited value of a Gaussian waveform.

Another example of a mode-locked semiconductor laser is found in "Generation of 33 GHz stable pulse trains by subharmonic electrical modulation of a monolithic passively mode-locked semiconductor laser" written by T. Hoshida et al. in ELECTRONICS LETTERS, Vol. 32, No. 6, Mar. 14th, 1996, pp. 572–573. Subharmonic hybrid mode-locking of a monolithic semiconductor laser was reported. According to the article, 33 GHz pulse trains with reduced phase noise were obtained from the laser by modulating its saturable absorber electrically at cavity subharmonic frequencies of 16.5, 11 and 8.25 GHz.

Still another example of a mode-locked semiconductor laser is found in "Monolithic strained InGaAsP multiple-quantum-well lasers with integrated electroabsorption modulators for active mode locking" written by Kenji Sato et al. in Applied Physics Letters, Vol. 65, No. 1, Jul. 4th, 1994, pp. 1–3. The article reported active mode locking by monolithic lasers with integrated electroabsorption modulators using strained-InGaAsP multiple quantum wells. The electroabsorption modulator acted as a short optical gate when a sinusoidal voltage was driven at a deep bias point. Pulse widths as short as 2 ps was obtained at a repetition rate of 16.3 GHz for a 2.5-mm-long monolithic laser.

Yet another example of a mode-locked semiconductor laser is found in "Multifunctional Application of Monolithic Mode Locked Laser in (O)TDM Systems: Pulse Generation and Optical Clock Recovery" written by E. Lach et al., 22nd European Conference on Optical Communication—ECOC'96, Oslo, pp. 4.23–4.26. There was reported multifunctional operation of monolithic active/passive mode locked DBR laser for 4×10 Gb/s OTDM with performance at STM-64 frequency: nearly time-bandwidth limited (<0.4) pulses (<10 ps), large pulse extinction (>20 dB) and optical clock recovery (10 GHz) from 40 Gb/s data.

Still yet another example of a mode-locked semiconductor laser is found in "Short Pulse Generation Using Multi-segment Mode-Locked Semiconductor Lasers" written by Dennis J. Derickson et al. in IEEE JOURNAL OF QUANTUM ELECTRONICS, Vol. 28, No. 10, October 1992, pp. 2186–2202. There has been suggested mode-locked semiconductor lasers incorporating rate multiple contacting segments. The functions of gain, saturable absorption, gain modulation, repetition rate tuning, wavelength tuning, and electrical pulse generation are integrated on a single semiconductor chip. The optimization of the performance of multisegment mode-locked lasers are accomplished in terms of material parameters, wavelength parameters, electrical parasitics, and segment length.

FIG. 1 illustrates one of conventional mode-locked semiconductor lasers. The illustrated mode-locked semiconductor laser includes a substrate 61 on which are formed a first cladding layer 52, waveguide layer 2, a second cladding layer 51, a cap layer 41, and an electrode 31 in this order. An electrode 32 is formed on a lower surface of the substrate 61. The waveguide layer 2 is comprised of a saturable absorber section 11, a gain section 12, a phase control section 16, and a distributed Bragg reflector section 15. An active layer 22 is formed in the saturable absorber section 11 and the gain section 12, and a non-absorptive waveguide layer 23 is formed in the distributed Bragg reflector section 15 and the phase control section 16.

The active layer 22 has a multiple quantum-well (QW) structure where well layers are made of InGaAs, and barrier layers are made of InGaAsP. The non-absorptive waveguide layer 23 has an absorption edge wavelength of 1.3 $\mu$m at bulk of InGaAsP. A diffraction grating 26 is formed in the distributed Bragg reflector section 15 at a boundary between the non-absorptive waveguide layer 23 and the second cladding layer 51. The mode-locked semiconductor laser is covered at an end thereof with highly reflective coating material 7.

In the mode-locked semiconductor laser having the above-mentioned structure, a reverse bias voltage is applied to the saturable absorber section 11, and a current is applied to the gain section 12. As a result, mode-locking operation is carried out, and optical frequency bandwidth is restricted in the distributed Bragg reflector section 15. Hence, a longitudinal mode which does not contribute to the mode-locking operation is suppressed, resulting in that short pulse characteristic approximate to Fourier transform limit can be obtained.

In addition, it is possible to continuously control an oscillation wavelength in dependence on conditions for an injection current to the distributed Bragg reflector section 15 and the phase control section 16.

In general, a mode-locked semiconductor laser is required to be electrically controlled by a stabilizing high frequency power source in order to enhance accuracy in a repetition rate and stability in operation in the application thereof to optical communication. To this end, both a high frequency signal and a reverse bias voltage have been applied to a saturable absorber section in a conventional mode-locked semiconductor laser. In this process, the optimization of a high frequency circuit is necessary to be carried out, for instance, by reduction in a parasitic capacitance and/or impedance matching in order to enhance an efficiency with which high frequency signals are applied to a saturable absorber section.

However, even if a saturable absorber section were designed so that an efficiency with which high frequency signals are applied thereto, conditions such as a section length and a bias voltage may get out of an optimal range for the mode-locked semiconductor laser to conduct saturable absorber operation.

SUMMARY OF THE INVENTION

In view of the foregoing problems of the conventional mode-locked semiconductor laser, it is an object of the present invention to provide a mode-locked semiconductor laser capable of enhancing a high frequency signal application efficiency with conditions for causing saturable absorption operation, such as a section length and a bias voltage, being kept in an optimal range.

It is also an object of the present invention to provide a method of driving the above-mentioned mode-locked semiconductor laser.

In one aspect, there is provided a mode-locked semiconductor laser including (a) a saturable absorber section, (b) a gain section having the same composition as that of the saturable absorber section, (c) a non-absorptive waveguide section having an absorption edge wavelength shorter than an oscillation wavelength of the gain section, (d) an electroabsorption modulator section having an absorption edge wavelength intermediate between an oscillation wavelength of the gain section and an absorption edge wavelength of the non-absorptive waveguide section, and (e) a distributed Bragg reflector section having the same composition as that of the non-absorptive waveguide section and including a diffraction grating, the sections (a) to (e) being optically coupled to one another in a single waveguide.

The saturable absorber section and the gain section may be comprised of an active layer, the non-absorptive waveguide section and the distributed Bragg reflector section may be comprised of a non-absorptive waveguide layer, and the electroabsorption modulator section may be comprised of an electroabsorption layer. In such an arrangement, the non-absorptive waveguide layer may be designed to have an absorption edge wavelength shorter than an oscillation wavelength of the active layer, and the electroabsorption layer may be designed to have an absorption edge wavelength intermediate between an oscillation wavelength of the active layer and an absorption edge wavelength of the non-absorptive waveguide layer.

It is preferable that an optical pulse width is designed to be minimized in the saturable absorber section, and that a high frequency application efficiency and a modulation factor are optimized in the electroabsorption modulator section in terms of a section length parameter and a material parameter.

The mode-locked semiconductor laser may further include a dc reverse-bias voltage source for applying a dc reverse-bias voltage to the saturable absorber section, a dc current source for applying a dc current to the gain section, a dc current source for applying a dc current to the non-absorptive waveguide section, a dc reverse-bias voltage source and a sine-wave modulated voltage source for applying a dc reverse-bias voltage and a sine-wave modulated voltage to the electroabsorption modulator section, and/or a dc current source for applying a dc current to the distributed Bragg reflector section. In place of the dc reverse-bias voltage source for applying a dc reverse-bias voltage to the saturable absorber section, there may be used a dc forward-bias voltage source for applying a dc forward-bias voltage to the saturable absorber section. In place of a dc reverse-bias voltage source and a sine-wave modulated voltage source for applying a dc reverse-bias voltage and a sine-wave modulated voltage to the electroabsorption modulator section, there may be used a dc forward-bias voltage source and a sine-wave modulated voltage source for applying a dc forward-bias voltage and a sine-wave modulated voltage to the electroabsorption modulator section.

There is further provided a mode-locked semiconductor laser including (a) a substrate, (b) a first cladding layer having a first conductivity and formed on the substrate, (c) a waveguide layer formed on the first cladding layer, (d) a second cladding layer having a second conductivity and formed on the waveguide layer, (e) a cap layer formed on the second cladding layer, (f) a pair of electrodes between which the elements (a) to (e) are sandwiched, wherein the waveguide layer includes (c-1) an active layer, (c-2) first and second non-absorptive waveguide layers each having an absorption edge wavelength shorter than an oscillation wavelength of the active layer, the second non-absorptive waveguide layer having a diffraction grating, and (c-3) an electroabsorption layer sandwiched between the first and second non-absorptive waveguide layers and having an absorption edge wavelength intermediate between an oscillation wavelength of the active layer and an absorption edge wavelength of first and second the non-absorptive waveguide layers.

The active layer, first and second non-absorptive waveguide layers, and electroabsorption layer may be designed to have a length and be made of material so that an optical pulse width is minimized in the active layer, and that an efficiency with which high frequency is applied to the electroabsorption layer and a modulation factor in the electroabsorption layer are optimized.

In another aspect, there is provided a method of driving a mode-locked semiconductor laser including (a) a saturable absorber section, (b) a gain section having the same composition as that of the saturable absorber section, (c) a non-absorptive waveguide section having an absorption edge wavelength shorter than an oscillation wavelength of the gain section, (d) an electroabsorption modulator section having an absorption edge wavelength intermediate between an oscillation wavelength of the gain section and an absorption wavelength of the non-absorptive waveguide section, and (e) a distributed Bragg reflector section having the same composition as that of the non-absorptive waveguide section and including a diffraction grating, the sections (a) to (e) being optically coupled to one another in a single waveguide, the method including the steps of (a) applying a dc reverse-bias voltage or a dc forward-bias voltage to the saturable absorber section, (b) applying a dc current to the gain section, and (c) applying a dc reverse-bias voltage or a dc forward-bias voltage, and a sine-wave modulated voltage to the electroabsorption modulator section.

It is preferable that the dc reverse- or forward-bias voltage is applied to the saturable absorber section so that an optical pulse width is minimized in the saturable absorber section.

The above-mentioned method may further include the steps of applying a dc current to the distributed Bragg reflector section, and/or applying a dc current to the non-absorptive waveguide section, in the former case of which it is preferable that the dc current is controlled in an amount to control the oscillation wavelength of the gain section.

The mode-locked semiconductor laser in accordance with the present invention is designed to have an electroabsorption modulator section having an absorption edge wavelength intermediate between an oscillation wavelength of the gain section and an absorption edge wavelength of the non-absorptive waveguide section. In addition, the electroabsorption modulator section is designed to have an optimized efficiency of applying high frequency thereto and an optimized modulation factor in terms of section length and material parameters.

Hence, it is no longer necessary to design a saturable absorber section in such a way that a frequency signal application efficiency is enhanced, and the conditions such as a section length and a bias voltage for causing saturable absorber operation do not get out of an optimal range.

In addition, it would be possible to establish a condition where modulation signals transmitted from a stabilizing high frequency power source can be efficiently applied to the saturable absorber section with short pulse characteristic approximate to Fourier transform limit being maintained. This ensures that input power of the modulation signals transmitted from a stabilizing high frequency power source can be reduced. In some cases, a preamplifier may be omitted.

It is possible to apply modulation signals having greater intensity to the modulation section, resulting in that optical modulation factor can be deepened in a resonator, and detuning range could be readily increased and timing jitter could be readily decreased.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENT

Figure 1:
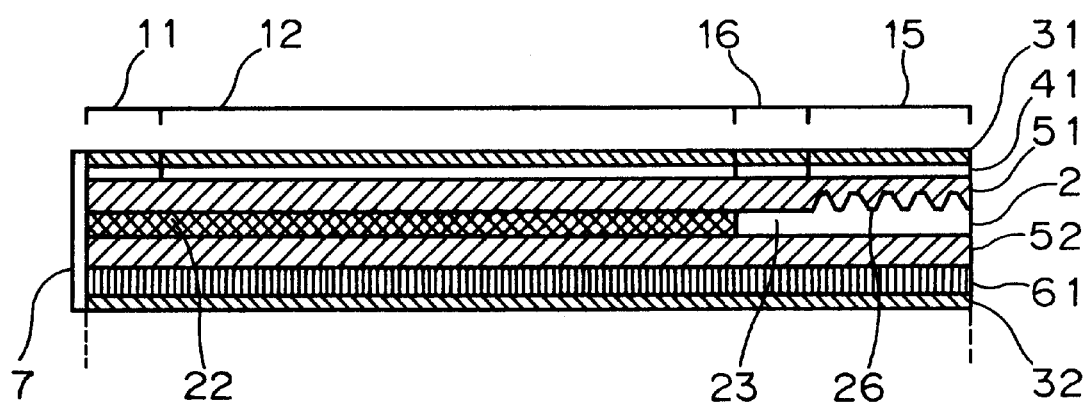
FIG. 1 is a cross-sectional view illustrating a conventional mode-locked semiconductor laser.
Figure 2:
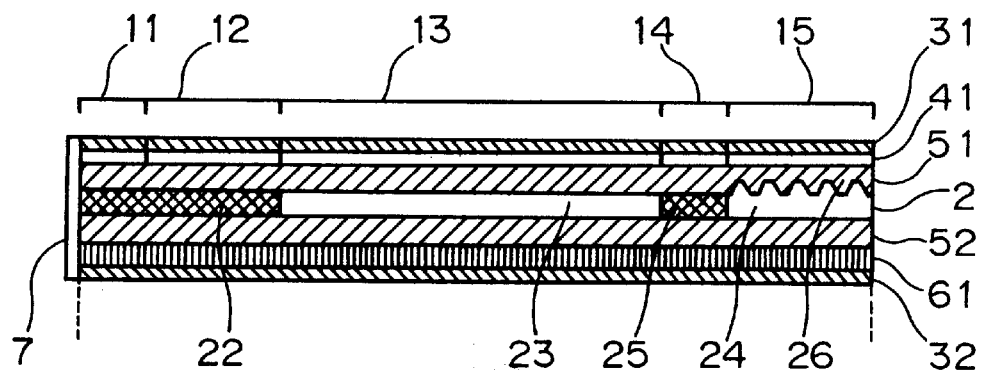
FIG. 2 is a cross-sectional view illustrating a mode-locked semiconductor laser in accordance with a preferred embodiment of the invention.

FIG. 2 illustrates a mode-locked semiconductor laser in accordance with the preferred embodiment of the invention. The illustrated mode-locked semiconductor laser includes a substrate 61 on which are formed an n-type cladding layer 52, a waveguide layer 2, a p-type cladding layer 51, a cap layer 41, and a p-type electrode 31 in this order. An n-type electrode 32 is formed on a lower surface of the substrate 61.

The waveguide layer 2 is comprised of a saturable absorber section 11, a gain section 12, a non-absorptive waveguide section 13, an electroabsorption modulator section 14, and a distributed Bragg reflector section 15. An active layer 22 is formed in the saturable absorber section 11 and the gain section 12, first and second non-absorptive waveguide layers 23 and 24 are formed in the non-absorptive waveguide section 13 and the distributed Bragg reflector section 15, respectively, and an electroabsorption layer 25 is formed in the electroabsorption modulator section 14.

The first and second non-absorptive waveguide layers 23 and 24 are designed to have an absorption edge wavelength shorter than an oscillation wavelength of the active layer 22. The electroabsorption layer 25 is designed to have an absorption edge wavelength intermediate between an absorption edge wavelength of the first and second non-absorptive waveguide layers 23 and 24 and an oscillation wavelength of the active layer 22. A diffraction grating 26 is formed in the distributed Bragg reflector section 15 at a boundary between the second non-absorptive waveguide layer 24 and the p-type cladding layer 51. The mode-locked semiconductor laser is covered at an end thereof with highly reflective coating material 7.

A section length and material of which each of the sections 11 to 15 is made are determined independently in each of the sections so that an optical pulse width is minimized in the saturable absorber section 11, and that an efficiency with which high frequency is applied to the electroabsorption modulator section 14 and a modulation factor in the electroabsorption modulator section 14 are optimized.

Figure 3:
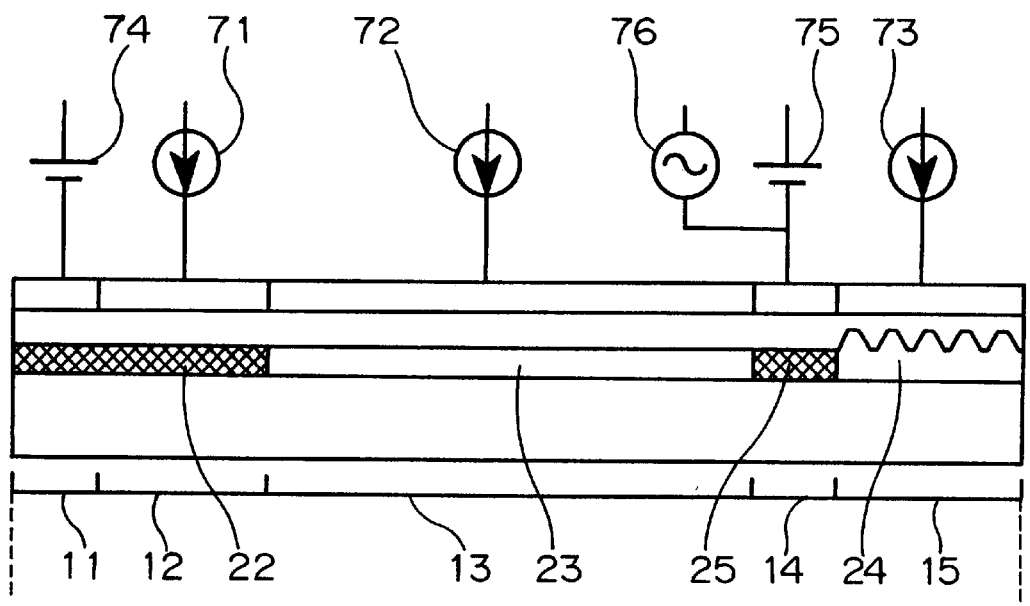
FIG. 3 is a schematic view illustrating an example of wiring arrangement for the mode-locked semiconductor laser illustrated in FIG. 2.

FIG. 3 illustrates a wiring arrangement for application of a current, a reverse bias voltage and high frequency to the mode-locked semiconductor laser illustrated in FIG. 2.

The mode-locked semiconductor laser conducts mode-locked operation by applying a dc current to the gain section 12 from a dc current source 71 and by applying a reverse bias voltage to the saturable absorber section 11 from a dc voltage source 74. The reverse bias voltage applied to the saturable absorber section 11 from the dc voltage source 74 is determined so that an optical pulse width is minimized. With the optical pulse width being kept minimized, a dc voltage source 75 is designed to have such a bias condition that modulation signals transmitted from a stabilizing high frequency power source 76 are effectively applied to the electroabsorption modulator section 14. A circuit from the stabilizing high frequency power source 76 to the electroabsorption modulator section 14 is impedance-matched.

A dc current source 72 applies a dc current to the non-absorptive waveguide section 13. A carrier density in the second non-absorptive waveguide layer 24 is increased, when a dc current source 73 applies a dc current to the distributed Bragg reflector section 15. As a result, a refractive index in the second non-absorptive waveguide layer 24 is decreased, and thus the Bragg wavelength shifts to a shorter wavelength range. Accordingly, an oscillation wavelength can be controlled by a current applied to the distributed Bragg reflector section 15 from the dc current source 73.

Hereinbelow is explained the actual operation of the mode-locked semiconductor laser illustrated in FIG. 2 when operated with the wiring arrangement illustrated in FIG. 3.

The saturable section 11, the gain section 12, the non-absorptive waveguide section 13, the electroabsorption modulator section 14, and the distributed Bragg reflector section 15 were designed to have a length of 75 $\mu$m, 500 $\mu$m, 3850 $\mu$m, 100 $\mu$m, and 300 $\mu$m, respectively. The mode-locked semiconductor laser had a total length of 4825 μm. The substrate 61, the n-type cladding layer 52 and the p-type cladding layer 51 were made of InP, the waveguide layer 2 had an InGaAs/InGaAsP multiple quantum well structure, and the cap layer 41 was made of InGaAs.

The active layer 22 was comprised of six InGaAs well layers with width of 4 nm separated by five 10 nm thick InGaAsP barrier layers each having an absorption edge wavelength of 1.2 μm. As a result, the active layer 22 had a wavelength of 1.55 μm in equivalence of an absorption edge wavelength at a bulk. Similarly to the active layer 22, the InGaAs well layers and the InGaAsP barrier layers constituting the first and second non-absorptive waveguide layers 23, 24 and the electroabsorption layer 25 were designed to have a certain thickness so that the first and second non-absorptive waveguide layers 23, 24 and the electroabsorption layer 25 had a wavelength of 1.3 μm and 1.48 μm in equivalence of an absorption edge wavelength at a bulk, respectively. The diffraction grating 26 was obtained by forming projections and recesses in the form of sine-wave having a cycle of 244 nm and an amplitude of 100 nm.

In the mode-locked semiconductor laser having the above-mentioned structure, a reverse bias voltage of about −1 V was applied to the saturable absorber section 11, a dc current of about 100 mA was applied to the gain section 12, and both a reverse bias voltage of about −2 V and a sine-wave modulation voltage having an input power of about 7 dBm and a frequency of 10 GHz were applied to the electroabsorption modulator section 14. As a result, there was obtained an optical pulse output having an optical pulse width of about 3 ps and an oscillation wavelength width of about 0.8 nm. The thus obtained optical pulse output was almost in the form of Fourier transform limit. Timing jitter was about 0.4 ps.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-270051 filed on Oct. 11, 1996 including specification, claims, drawings and summary is incorporated herein by reference in its entirety.

What is claimed is:

1. A mode-locked semiconductor laser comprising:
    (a) a saturable absorber section;
    (b) a gain section having the same composition as that of said saturable absorber section;
    (c) a non-absorptive waveguide section having an absorption edge wavelength shorter than an oscillation wavelength of said gain section;
    (d) an electroabsorption modulator section having an absorption edge wavelength intermediate between an oscillation wavelength of said gain section and an absorption edge wavelength of said non-absorptive waveguide section; and
    (e) a distributed Bragg reflector section having the same composition as that of said non-absorptive waveguide section and including a diffraction grating, said sections (a) to (e) being optically coupled to one another in a single waveguide.

2. The mode-locked semiconductor laser as set forth in claim 1, wherein said saturable absorber section and said gain section are comprised of an active layer, said non-absorptive waveguide section and said distributed Bragg reflector section are comprised of a non-absorptive waveguide layer, and said electroabsorption modulator section is comprised of an electroabsorption layer.

3. The mode-locked semiconductor laser as set forth in claim 2, wherein said non-absorptive waveguide layer has an absorption edge wavelength shorter than an oscillation wavelength of said active layer, and wherein said electroabsorption layer has an absorption edge wavelength intermediate between an oscillation wavelength of said active layer and an absorption edge wavelength of said non-absorptive waveguide layer.

4. The mode-locked semiconductor laser as set forth in claim 1, wherein a section length and material of which a section is made are determined independently in each of said sections so that an optical pulse width is minimized in said saturable absorber section, and that an efficiency with which high frequency is applied to said electroabsorption modulator section and a modulation factor in said electroabsorption modulator section are optimized.

5. The mode-locked semiconductor laser as set forth in claim 1, further comprising a dc reverse-bias voltage source for applying a dc reverse-bias voltage to said saturable absorber section.

6. The mode-locked semiconductor laser as set forth in claim 1, further comprising a dc forward-bias voltage source for applying a dc forward-bias voltage to said saturable absorber section.

7. The mode-locked semiconductor laser as set forth in claim 1, further comprising a dc current source for applying a dc current to said gain section.

8. The mode-locked semiconductor laser as set forth in claim 1, further comprising a dc current source for applying a dc current to said non-absorptive waveguide section.

9. The mode-locked semiconductor laser as set forth in claim 1, further comprising a dc reverse-bias voltage source and a sine-wave modulated voltage source for applying a dc reverse-bias voltage and a sine-wave modulated voltage to said electroabsorption modulator section.

10. The mode-locked semiconductor laser as set forth in claim 1, further comprising a dc forward-bias voltage source and a sine-wave modulated voltage source for applying a dc forward-bias voltage and a sine-wave modulated voltage to said electroabsorption modulator section.

11. The mode-locked semiconductor laser as set forth in claim 1, further comprising a dc current source for applying a dc current to said distributed Bragg reflector section.

12. A method of driving a mode-locked semiconductor laser comprising:
    (a) a saturable absorber section;
    (b) a gain section having the same composition as that of said saturable absorber section;
    (c) a non-absorptive waveguide section having an absorption edge wavelength shorter than an oscillation wavelength of said gain section;
    (d) an electroabsorption modulator section having an absorption edge wavelength intermediate between an oscillation wavelength of said gain section and an absorption wavelength of said non-absorptive waveguide section; and
    (e) a distributed Bragg reflector section having the same composition as that of said non-absorptive waveguide section and including a diffraction grating, said sections (a) to (e) being optically coupled to one another in a single waveguide, said method comprising the steps of:
- (a) applying a dc reverse-bias voltage or a dc forward-bias voltage to said saturable absorber section;
- (b) applying a dc current to said gain section; and
- (c) applying a dc reverse-bias voltage or a dc forward-bias voltage, and a sine-wave modulated voltage to said electroabsorption modulator section.

13. The method as set forth in claim 12, wherein said dc reverse-bias voltage is applied to said saturable absorber section so that an optical pulse width is minimized in said saturable absorber section.

14. The method as set forth in claim 12, further comprising the step of applying a dc current to said distributed Bragg reflector section.

15. The method as set forth in claim 14, wherein said dc current of the distributes Bragg section is controlled in an amount to control said oscillation wavelength of said gain section.

16. The method as set forth in claim 12, further comprising the step of applying a dc current to said non-absorptive waveguide section.

* * * * *